United States Patent
Wall et al.

(10) Patent No.: US 6,224,682 B1
(45) Date of Patent: May 1, 2001

(54) CVD OF METALS CAPABLE OF RECEIVING NICKEL OR ALLOYS THEREOF USING INERT CONTACT

(75) Inventors: Donald Rene Wall, Poughkeepsie; John Joseph Garant, Hopewell Junction; Kevin Michael Prettyman, Holmes; Srinivasa S. N. Reddy, Lagrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/489,976

(22) Filed: Jan. 21, 2000

Related U.S. Application Data

(62) Division of application No. 09/050,491, filed on Mar. 30, 1998.

(51) Int. Cl.[7] .................................................. C23C 16/00
(52) U.S. Cl. ..................................... 118/726; 118/723 VE
(58) Field of Search .............................. 118/726, 723 FI, 118/723 EB, 717, 723 VE; 392/388, 389, 390, 386

(56) References Cited

U.S. PATENT DOCUMENTS

| | | |
|---|---|---|
| 4,590,095 | 5/1986 | Park . |
| 4,664,942 | 5/1987 | Park . |
| 4,687,684 | 8/1987 | Restall et al. . |
| 4,708,917 | 11/1987 | Swarr et al. . |
| 5,028,385 | 7/1991 | Baldi . |
| 5,262,466 * | 11/1993 | Baldi .................................. 524/430 |
| 5,312,582 | 5/1994 | Donado . |
| 5,592,686 | 1/1997 | Third et al. . |
| 5,869,134 | 2/1999 | Reddy et al. . |

* cited by examiner

*Primary Examiner*—Jeffrie R. Lund
*Assistant Examiner*—Sylvia R. MacArthur
(74) *Attorney, Agent, or Firm*—Margaret A. Pepper

(57) ABSTRACT

The present invention discloses a CVD (Chemical Vapor Deposition) process where nickel or alloys thereof, such as, Ni/Cu, Ni/Co, are deposited on metal surfaces which are capable of receiving nickel or alloys thereof, using an Iodide source, preferably an Iodide salt, such as, Ammonium Iodide or Copper Iodide, with at least one inert stand-off in contact with the receiving metal surface. This invention basically allows the CVD of nickel (Ni) on molybdenum (Mo) or tungsten (W) where the nickel source is physically isolated from the refractory metal surface to be plated using at least one inert material that is in floating contact with the refractory metal surface that needs to be coated with at least one layer of nickel or alloy thereof.

20 Claims, 1 Drawing Sheet

CVD OF METALS CAPABLE OF RECEIVING NICKEL OR ALLOYS THEREOF USING INERT CONTACT

This Patent Application is a Divisional of U.S. patent application Ser. No. 09/050,491, filed on Mar. 30, 1998.

FIELD OF THE INVENTION

The present invention discloses a CVD (Chemical Vapor Deposition) process where nickel or alloys thereof, such as, Ni/Cu, Ni/Co, are deposited on metal surfaces which are capable of receiving nickel or alloys thereof, using an Iodide source, preferably an Iodide salt, such as, Ammonium Iodide or Copper Iodide, with at least one inert stand-off in contact with the receiving metal surface. This invention basically allows the CVD of nickel (Ni) on molybdenum (Mo) or tungsten (W) where the nickel source is physically isolated from the refractory metal surface to be plated using at least one inert material that is in floating contact with the refractory metal surface that needs to be coated with at least one layer of nickel or alloy thereof.

BACKGROUND OF THE INVENTION

In the electronics industry it is often desirable to cover or coat an existing refractory metal surface with a brazable or solderable surface. Applications for such a procedure, include but are not limited to, I/O pads, wire bond pads, C4's (Controlled Collapse Chip Connection), seal bands, to name a few.

Many methods are available and practiced in the industry to cover or coat an existing refractory metal surface with a brazable or solderable surface. The most commonly used approach for treating refractory metal surfaces in the microelectronic packaging business is to employ electroplating or electroless-plating of pure or substantially pure Ni (nickel) film from an aqueous bath which is at or near room temperature.

Nickel is generally the metal of choice for plating refractory metals because it can be made to bond well with any of the refractory metals. In addition, Ni possesses good wetting characteristics for subsequent bonding processes, such as brazing or soldering, and it has excellent corrosion characteristics.

Recently, a few high temperature, dry, halide transfer processes have been disclosed and subsequently used by the industry for the purpose of plating nickel on molybdenum or tungsten.

One method disclosed in U.S. Pat. No. 4,590,095 (Park) uses a pack cementation approach. The essential elements for pack cementation are a powder metal source, an activator, and an object to be plated. Basically, the elements are placed in a chamber and the object is buried in a mixture of the powder metal source, activator, and usually an inert ceramic powder, such as, alumina, and then heated to a high temperature to establish vapor transport. The process allows for mass transfer of the gas species. For the Park process pure nickel powder was used as the metal source and the activator used was ammonium iodide.

A departure from this pack cementation approach for a halide transfer process was disclosed in U.S. Pat. No. 4,664,942 (Park). In this case ammonium iodide and pure nickel were still the essential elements for the halide transfer process. However, in this case nickel screens were used as the metal source rather than the nickel powder. And, the objects to be plated, containing exposed surfaces of refractory metal, were placed in stacks with the nickel screens acting as separators in the reaction vessel or work boat. The ammonium iodide activator for the process was held in a separate crucible within the work boat. The elements were again heated to a high temperature to establish vapor transport. The open nickel screen allowed for mass transfer of the gas species and also served as the nickel source.

Most recently, another improvement was put forward in U.S. patent application Ser. No. 08/668,295 (Reddy et al.), filed on Jun. 21, 1996, entitled "CVD OF METALS CAPABLE OF RECEIVING NICKEL OR ALLOYS THEREOF USING IODIDE", presently assigned to the assignee of the instant Patent Application, and the disclosure of which is incorporated herein by reference, where CuI was disclosed as a preferred iodide activator providing various advantages.

In general, for halide transfer metal deposition processes, it is very desirable that the solid metal source material and the metal area to be plated are kept in close physical proximity to each other. This condition is necessary in order to maintain a reasonable rate of metal deposition during the process.

In each of the known halide transfer processes, the metal source material, powder or screens, were kept in close physical proximity to the refractory metal surface to be plated, however, in addition, due to the specific geometrical configuration of each assembly, the metal source material can at least at some point, also come into direct physical contact with the metal surface to be plated. It has been discovered that when the source metal and the target areas do touch each other, during the deposition process, while using any of the known processes, they, the source and the sink, can weld together and form a bond. When the nickel plated part and the other assembly materials are subsequently separated, after the deposition process has been completed, a defect in the deposited nickel film can be readily observed. This defect can take the form of a taffy pull of metal or a piece of metal debris or a missing section of the deposited nickel film, etc. This condition will normally, result in the disqualification of the part or work piece.

The present invention, however, teaches a new method for configuring a work boat in a halide transfer process where nickel metal is electrolessly deposited onto a refractory metal surface. With the method of this invention the metal source and the refractory metal surface to be plated, are kept in close physical proximity, as required, to effect rapid deposition rate, but where at least one inert stand-off is also in contact with the receiving metal surface such that the source metal and the surface being plated are maintained in complete physical isolation from each other. With this invention there does not exist any opportunity for the source and the sink to touch and weld and form a bond. Consequently, the disqualifying defect, that appears when the metal source and the refractory metal are in contact, which happens in the prior art processes is totally avoided.

PURPOSES AND SUMMARY OF THE INVENTION

The invention is a novel process where nickel or alloys thereof, are deposited on refractory metal surfaces using a CVD (Chemical Vapor Deposition) process with Iodide, using at least one inert stand-off in contact with the receiving metal surface to physically isolate the nickel source.

Therefore, one purpose of this invention is to provide an apparatus and a process that will provide a deposition of nickel or alloys thereof, on refractory metal surfaces with Iodide, preferably an iodide salt, as the active reagents, using at least one inert stand-off in contact with the receiving metal surface to physically isolate the nickel source.

Therefore, in one aspect this invention comprises a process for depositing at least one source metal onto at least one receiving metal, wherein said receiving metal is securely bonded to a ceramic substrate, comprising the steps of:

(a) placing said ceramic substrate containing said receiving metal in a chamber containing at least one source metal, and wherein at least a portion of at least one inert material is in floating contact with at least a portion of said at least one receiving metal, (b) heating said chamber and its contents in a non-oxidizing environment at a temperature in the range from between about 700° C. to about 1,000° C., for a period of time ranging to a maximum of about 200 minutes, (c) allowing said chamber and its contents to cool so that said receiving metal has at least one layer of said source metal adhered thereto, and (d) removing said ceramic substrate containing said adhered layer of source metal to said receiving metal, from said chamber.

In another aspect this invention comprises a process for depositing nickel or alloys thereof on at least one receiving metal, wherein said receiving metal is securely bonded to a ceramic substrate, comprising the steps of:

(a) placing said ceramic substrate containing said receiving metal in a chamber containing at least one discrete nickel or alloy thereof and a discrete portion of at least one iodide source, and wherein at least a portion of at least one inert material is in floating contact with at least a portion of said at least one receiving metal, (b) heating said chamber and its contents in a non-oxidizing environment at a temperature in the range from between about 700° C. to about 1,000° C., for a period of time ranging to a maximum of about 200 minutes, (c) allowing said chamber and its contents to cool so that said receiving metal has at least one layer of said nickel or alloy thereof adhered thereto, and (d) removing said ceramic substrate containing said adhered layer of nickel or alloy thereof to said receiving metal, from said chamber.

In yet another aspect this invention comprises an apparatus comprising a container containing, at least one ceramic substrate having at least one receiving metal securely bonded thereto, and at least one inert material physically separating at least one source metal from said at least one receiving metal.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
FIG. 1, illustrates a cross-sectional view of a preferred structure of this invention.

This invention discloses a high temperature halide transfer reaction process providing for physical isolation between the metal source and the area for metal deposition, but concurrently maintaining a very close proximity of the two in order to allow for efficient, uniform, and timely progress of the transfer process.

In this invention the metal to be transferred and deposited is nickel or nickel alloy, the target area to be plated with nickel is refractory metal, such as, tungsten or molybdenum, and the carrier halide gas used is iodide. However, the intrinsic intent of the invention is directly applicable to other halide transfer processes of similar configuration.

One solution is to provide a reaction configuration where the source metal and the target deposition area are not able to come into direct physical contact, but that the source and sink are in close physical proximity and that gas transfer between them is not significantly impeded.

Physical isolation between the source metal and the refractory metal in the halide transfer process is done, according to the present invention, by separating the source nickel from the refractory metal target with at least one inert standoff. The inert standoff needs to be configured such that the passage of gas through the standoff is not significantly impeded. Gas species must be allowed to travel between the source metal and the deposition surface in order to effect plating. In addition, the inert material needs to be non-reactive to the iodide environment and is preferably, alumina, carbon (graphite), silica, zirconia, and combinations thereof.

The form factor for the standoff can be of two types, either reusable or disposable. Examples of the reusable standoff, include but are not limited to; a thin porous tile, a fibrous cloth, a ceramic standoff, or a ceramic coated metal mesh screen. Examples of the disposable stand-off, include but are not limited to; sacrificial papers, loose ceramic particles, or inert fibers. These standoffs are easily disseminated in the interface between the nickel source and the refractory metal to be plated before deposition and then are subsequently removed when the deposition reaction is complete. Removal is conveniently effected by simply removing it or blowing with compressed gas or washing with a spray, etc.

The metal source material to be used in combination with an inert stand-off can take any of several forms including but not limited to; metal foil, metal powder, metal plate, metal screens, to name a few. However, The preferred form would usually be a simple non-porous solid metal foil. This form is the most convenient from a geometrical perspective, it is universally supported by a stand-off, it provides for the most uniform distance between the source metal and the plating surface, it exhibits the simplest handling, and is the most inexpensive and most readily available.

Initially it may be presumed that in using a non-porous metal source, such as, a metal foil or a metal plate, that the deposition reaction efficiency would be compromised because gaseous species cannot pass through the metal barrier. However, with a halide transfer process, as in nickel transport with iodide for example, such is not the case. The deposition process works through the action of a carrier gas, iodide in the preferred embodiment. Iodide gas species react with the solid metal source, and form a gaseous metal halide. The metal halide then moves to the metal surface to be plated and the metal cation is reduced and deposited. The liberated gaseous iodide then returns to the source metal and the process repeats itself.

Therefore, once the iodide carrier gas has diffused into the assembly for the first time upon initial heat up, along the gaps created by the nickel foil barriers, it need not diffuse over such relatively long distances again during the process of deposition, because the carrier species are used locally over and over again at or near the same location within the assembly.

The important critical distance in this process is the distance between the source metal and the area to be plated as has been previously discussed. This distance is best maintained small and uniform using a flat non-porous metal foil and inert stand-offs that do not impede significantly the passage of the gaseous species effecting deposition.

It may also be presumed by the forgoing description of the invention that at all points where the inert stand-offs may be in direct contact with the metal surface to be plated, that metal deposition may be blocked or partially blocked at those particular locations, such that significant amounts of metal are not deposited under the stand-off leaving a potential area of little or no metal deposition, and an overall non-uniform coating of the depositing metal. Again, with the halide transfer process this has not been the case. Rather, in a most unexpected manner, the gaseous carrier species transferred and deposited metal atoms underneath the inert stand-offs, i.e., between the stand-off and the refractory metal surface being plated. This plating occurred to such an extent that the resulting metal deposited over the entire surface to be plated and was found to be uniform in thickness. Furthermore, surprisingly no physical evidence of where the inert stand-off material may have been located during the plating process was left on any of the surfaces after the cleaning process.

It is conjectured that the inert stand-off materials were actually floated up by the underside deposition of metal atoms in the process, allowing the inert stand-offs to maintain their purpose as stand-offs between the metal source and the surface being plated, but not compromising the depth or quality of the depositing metal film. It was also discovered that this condition existed even when the stand-offs were under mild load as dictated by the geometrical configuration of the overall assembly in the work boat.

Several tests were done in the laboratory using various inert separators. In each case, uniform and good quality deposits of nickel and nickel alloy on refractory metal surfaces of molybdenum and tungsten were obtained. Furthermore, in each case, the source and sink were maintained in total isolation from each other by the inert stand-off, even with the close physical proximity of each element to each other.

FIG. 1, illustrates a cross-sectional view of a preferred structure of this invention where a ceramic substrate 10, has at least one refractory metal 12, such as, for example, tungsten, molybdenum, etc., having at least one layer of nickel or nickel alloy 14.

Figure 2:
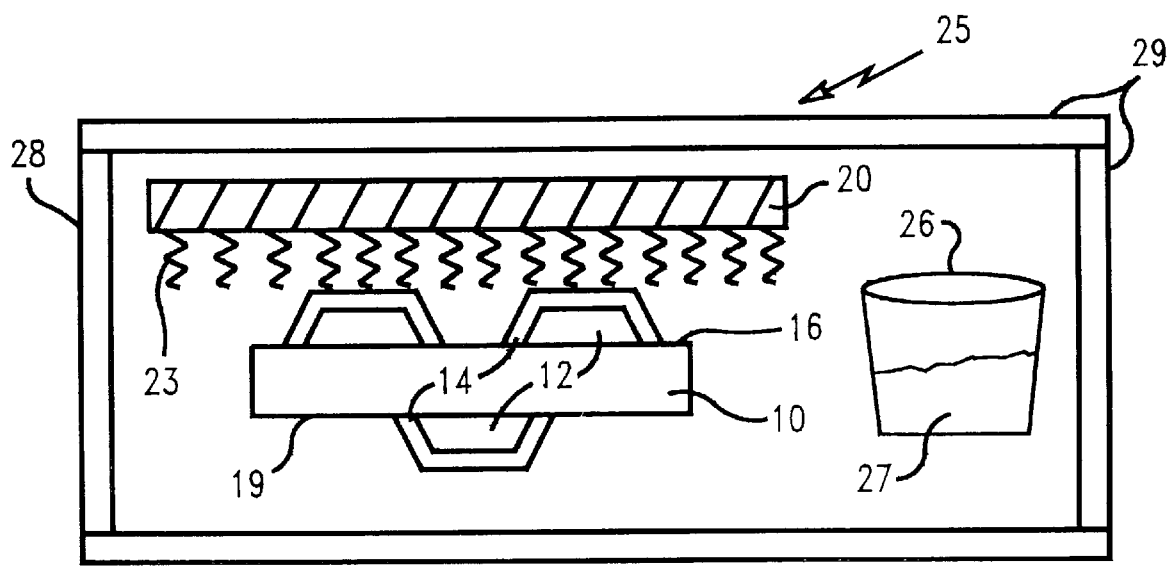
FIG. 2, illustrates a cross-sectional view of an apparatus of this invention.
Figure 3:
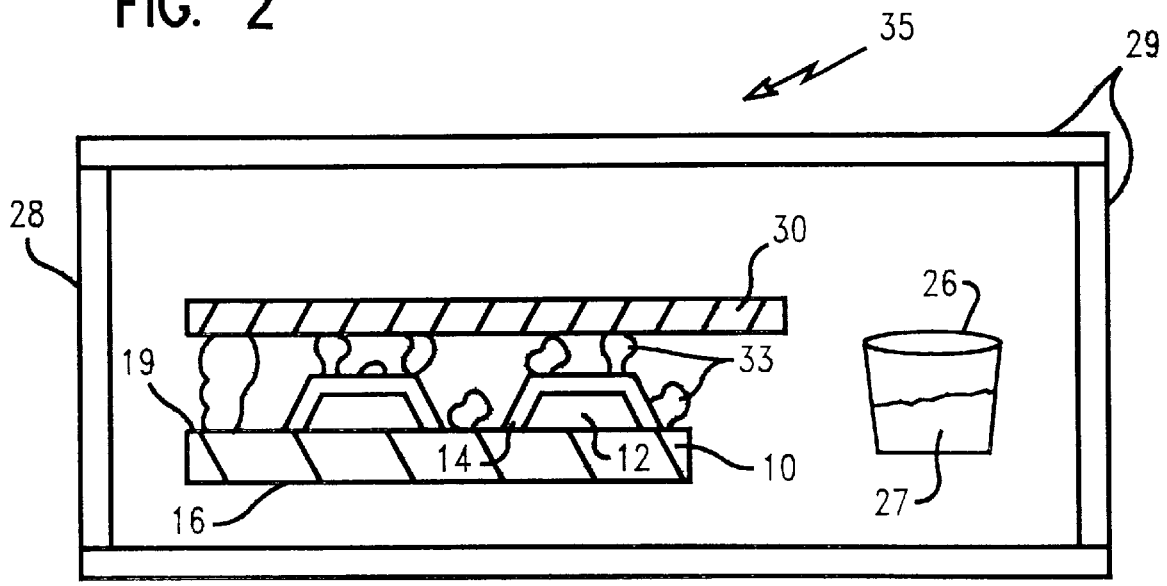
FIG. 3, illustrates a cross-sectional view of another apparatus of this invention.

FIGS. 2 and 3, show typical configurations of a reaction vessel to be used for the halide transfer process where the metal source and area to be plated, such as, a refractory metal pad, are held isolated.

FIG. 2, shows an example of a reusable standoff 23, such as, a porous tile 23, and FIG. 3, illustrates an example of a disposable stand off 33, such as, an inert ceramic particles 33.

FIG. 2, further illustrates a preferred apparatus of this invention where a boat or container 25, comprising of a box or chamber 28, and at least one accessible panel 29. The box 28, has at least one crucible 26, such as, a ceramic container 26, with iodide 27, preferably a solid CuI salt 27, or solid ammonium iodide salt 27, of no specific shape, size, or configuration. There is also at least one deposition metal source 20 or 30, preferably a solid non-porous nickel foil 20 or 30, wherein the deposition metal source 20, could be selected from a group comprising nickel or nickel alloys.

It is preferred that the at least one iodide source be selected from a group comprising AgI, $CoI_2$, CuI, $FeI_2$, $MnI_2$, $NH_4I$, $PbI_2$, $VI_2$, to name a few.

The at least one inert material 23 and/or 33, is preferably selected from a group comprising, fibrous cloth, porous ceramic tile, coked carbon paper, ceramic coated metallic screen, discrete particles, discrete fibers, fibrous material, screen mesh, to name a few.

The ceramic body 10, has at least one receiving or refractory metal feature 12, such as, an I/O pad or wirebond pad or seal band or a line, to name a few, on the first surface 16, and/or at least one receiving or refractory metal feature 12, such as, an I/O pad or wirebond pad or seal band or a line, to name a few, on the second surface 19, of the ceramic substrate or body 10.

The deposition metal source 20, basically, could be a single non-porous nickel foil 20, which would be sufficient to assist in completing the process. One could have more than one deposition metal source 20, such as, a first or upper deposition metal source 20, and a second or a lower deposition metal source 20, facing the second surface 19. For the purposes of illustration only, the deposition metal source 20, may be referred to as nickel foil 20.

The material for the deposition metal source 20, could be selected from a group comprising pure Ni or Ni/cobalt alloy or Ni/copper alloy, to name a few. The material for the deposition metal source 20, can be of any shape, size, or configuration, including powder, however, the preferred embodiment is a simple solid non-porous nickel foil.

In order to carry out this invention, in some cases, the deposition metal source 20, could be an inner wall or lining of the container 28. The discrete metal source structure 20, could be selected from a group comprising of nickel mesh screen, solid nickel sheet or foil, a nickel lining in the chamber, nickel powder, nickel alloy mesh screen, solid nickel alloy sheet or foil, a nickel alloy lining in the chamber and nickel alloy powder, to name a few.

The preferred refractory metal 12, is selected from a group comprising molybdenum, tungsten, or alloys or compounds thereof, including mixtures with other materials, such as, WC-Co.

The specific halide transfer process used to effect nickel plating could be any of several processes currently in use. However, in general the constituents of the reaction assembly, the metal source, activator, and surface to be plated, are built into a reaction vessel or work boat and then heated to a temperature high enough to effect a significant rate vapor phase transport of the metal source. For the case of CuI as the activator, and nickel metal as the source to be deposited on a refractory metal surface, such as, tungsten or molybdenum, one preferred heating profile would be to heat the contents from room temperature to between about 700° C. and about 1000° C., and then to hold the deposition process at this peak temperature for a time period from between about 1 minutes to about 200 minutes.

Using this Chemical Vapor Deposition process, in combination with the inert stand-offs, Ni and/or Ni-alloy films can be built upon the surfaces of the refractory metal 12, without defects. It has been seen that the thickness of the nickel layer 14, can be from between about 0.01 microns to layer thicknesses exceeding about 10–15 microns.

FIG. 3, illustrates another embodiment of this invention. The process for coating the refractory metal features 12, is the same as already discussed with reference to FIG. 2, except that the inert particles 33, can be sprinkled onto the exposed surface of the refractory or receiving metal 12, and that at least one nickel or alloy thereof is placed over the inert particles 33. The inert particles 33, are basically there to prevent the physical contact between the metal receiving surface of refractory metal 12, and the source material 20 and/or 30.

The inert particles 33, can be applied onto the surface of the refractory metal 12, by a number of ways, such as, for example, sprinkling the particles 33, onto the surface of the metal 12, or using an aerosol to spray the particles onto the surface of the refractory metal 12, etc. It should be noted that no particle size or particle distribution is necessary to operate this invention, as long as there is no physical contact between the source material 20 and/or 30, and the surface of the refractory metal 12. However, for most of the semiconductor microelectronic applications, it is preferred that the inert particles 33, have an average particle size between about 75 and about 100 microns.

In general terms, this invention discloses the presence of an inert material between the source, such as, nickel source, and the metal surface to be plated regardless as to how it is applied and/or configured.

The process of this invention provides advantages over the prior art processes. Most importantly it provides a method whereby uniform metal films are deposited that are completely free of defects associated with physical contact between the metal source and the metal surface being plated in a halide transfer deposition process.

Additionally, this process provides a cost effective method of manufacturing, because the use of a non-porous solid metal foil, as a metal source material, was not possible with prior art processes. Contrastingly, a simple metal foil is the preferred form factor for metal source in the present invention, providing significant technical and cost advantages.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus comprising a container containing, at least one ceramic substrate having at least one receiving metal securely bonded thereto, and at least one inert material physically separating at least one source metal from said at least one receiving metal.

2. The apparatus of claim 1, wherein said at least one inert material is porous.

3. The apparatus of claim 1, wherein at least one of said at least one inert material is porous and has a porosity between about 50 percent to about 99 percent.

4. The apparatus of claim 1, wherein at least one of said at least one inert material is a stand-off.

5. The apparatus of claim 1, wherein at least one of said at least one source metal is nickel or an alloy thereof.

6. The apparatus of claim 5, wherein said nickel alloy is selected from the group consisting of nickel-copper and nickel-cobalt.

7. The apparatus of claim 1, wherein at least one of said at least one inert material is selected from the group consisting of fibrous cloth, porous ceramic tile, coked carbon paper, ceramic coated metallic screen, discrete particles, discrete fibers, fibrous material and screen mesh.

8. The apparatus of claim 1, wherein said receiving metal bonded to said ceramic substrate is selected from the group consisting of molybdenum, tungsten, and alloys, compounds and mixtures thereof.

9. The apparatus of claim 8, wherein said nickel alloy is selected from the group consisting of nickel-copper and nickel-cobalt.

10. The apparatus of claim 1, wherein at least one of said at least one source metal is nickel or an alloy thereof, and wherein said nickel or alloy thereof is selected from the group consisting of nickel mesh screen, solid nickel sheet, solid nickel foil, a nickel lining in said chamber, nickel powder, nickel alloy mesh screen, solid nickel alloy sheet, solid nickel alloy foil, a nickel alloy lining in said chamber and nickel alloy powder.

11. The apparatus of claim 1, wherein said container has at least one panel to protect contents inside said container.

12. The apparatus of claim 1, wherein said container has a non-oxidizing environment and wherein said non-oxidizing environment is selected from the group consisting of argon, hydrogen, nitrogen, argon plus hydrogen, argon plus nitrogen, and hydrogen plus nitrogen.

13. The apparatus of claim 1, wherein said ceramic substrate is selected from the group consisting of glass ceramic and multilayered ceramic.

14. The apparatus of claim 1, wherein said at least one source metal forms a layer over said at least one receiving metal and wherein said layer has a thickness between about 0.01 micron and about 15 microns.

15. The apparatus of claim 14, wherein said layer has a thickness between about 3 microns and about 10 microns.

16. The apparatus of claim 1, wherein said container has at least one iodide source selected from the group consisting of AgI, $CoI_2$, CuI, $FeI_2$, $MnI_2$, $NH_4I$, $PbI_2$, and $VI_2$.

17. The apparatus of claim 16, wherein said at least one iodide source is contained within at least one crucible.

18. The apparatus of claim 16, wherein said at least one iodide source, and said at least one source metal are contained within at least one crucible.

19. The apparatus of claim 1, wherein said container and its contents are heated inside a furnace.

20. The apparatus of claim 1, wherein said inert material has an average particle size between about 75 and about 100 microns.

* * * * *